United States Patent [19]

Tallman et al.

[11] Patent Number: 5,771,345
[45] Date of Patent: Jun. 23, 1998

[54] INTEGRATED DIGITAL PROCESSING DEVICE AND METHOD FOR EXAMINING THE OPERATION THEREOF

[75] Inventors: James L. Tallman; John Dierks, both of Beaverton, Oreg.

[73] Assignee: Tektronix, Inc., Wilsonville, Oreg.

[21] Appl. No.: 638,058

[22] Filed: Apr. 25, 1996

[51] Int. Cl.[6] .................................................. G06F 11/00
[52] U.S. Cl. ............................... 395/183.06; 305/193.13; 305/183.15; 305/729
[58] Field of Search .................................... 395/433, 729, 395/293, 432, 183.01–183.22

[56] References Cited

U.S. PATENT DOCUMENTS 5,317,711  5/1994  Bourekas et al. ....................... 395/245

OTHER PUBLICATIONS

M. Morris, Mano, "Digital Design", second edition, Prentice–Hall, NJ, pp. 170–173, 1994.

*Primary Examiner*—Jack B. Harvey
*Assistant Examiner*—Jigar Pancholi
*Attorney, Agent, or Firm*—William A. Birdwell; Thomas F. Lenihan

[57] ABSTRACT

An integrated digital processing device and method for examining the operation thereof. An integrated multiple digital processing device has externally-accessible tag connections which provide signals representative of what circuit has access to external memory used by the processing device. The processing device includes a plurality of digital processor circuits, a DRAM refresh logic circuit, externally-accessible connections for receiving memory access signals from an external processor, and an arbitration circuit for determining which of the digital processor circuits, refresh logic circuit or external processor may have access to the external memory. The signals on the tag connections are provided by the arbitration circuit, and indicate which of the aforementioned circuits has access to the external memory at any moment. Preferably, an M-to-N line encoder is provided between the arbitration circuit and the externally-accessible tag connections to minimize the number of tag connections required to identify the circuit having access to the external memory.

10 Claims, 1 Drawing Sheet

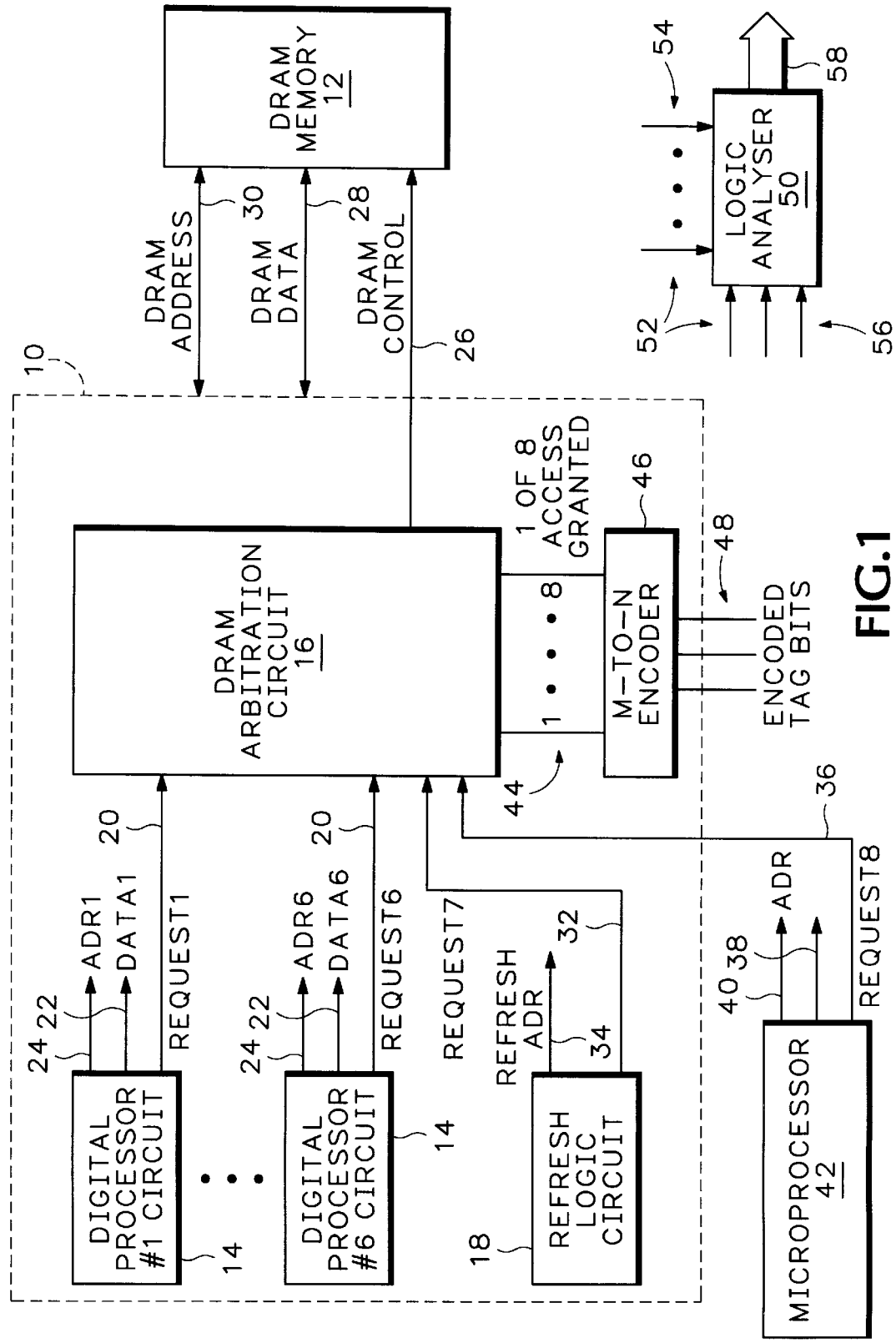

INTEGRATED DIGITAL PROCESSING DEVICE AND METHOD FOR EXAMINING THE OPERATION THEREOF

BACKGROUND OF THE INVENTION

This invention relates to integrated digital processing devices that interface with external memory and methods for examining the operation thereof and, particularly, to the structure and operation of processing devices that include multiple digital processor circuits.

There are digital signal processing applications where it is desirable to employ multiple digital processor circuits to perform digital signal processing tasks. For example, in an oscilloscope it may be desirable to employ multiple digital processor circuits to operate, essentially in parallel, on distinct data representing different parts of a signal waveform. It is also desirable to integrate the multiple processor circuits into a single processing device, an "integrated circuit," to save space and provide other commonly known advantages of integrated circuits.

Typically, a multiple processor circuit integrated digital processing device is adapted to communicate with external memory. To that end, the device also includes a memory access arbitration circuit, for determining which of the processor devices may have access to the external memory at any given moment.

Where the external memory is in the form of dynamic random access memory ("DRAM") devices, a memory refresh circuit is required, as is commonly known in the art. Typically, the memory refresh circuit is included in the integrated digital processing device. In that case, the memory access arbitration circuit also determines when the memory refresh circuit may have access to the external memory.

The multiple processor circuits within a multiple processor circuit integrated digital processing device typically have relatively specialized processing capability and are used in conjunction with a more powerful external digital processor circuit. However, since the external processor operates on the same data as the internal processing circuits, it requires access to the external memory of the integrated processing device and must achieve that access in competition with the internal processor circuits, and any memory refresh circuit. To that end, the integrated digital processing device is provided with external memory access connections so that the external processor circuit may have access to the external memory through the arbitration circuit.

While large scale integration of multiple digital processor circuits as described above provides advantages, it has the drawback that examination of the operation of a digital processing system employing a multiple processor device is difficult because the distinct processor circuits are embedded in a single integrated circuit with a limited number of pin connections. For example, a logic analyzer apparatus can be connected to the external memory access connections of the processing device to determine the state of the external memory access signals, but that does not reveal what internal processor, memory refresh or external processor circuit is accessing the external memory. This makes diagnosis of some problems difficult, if not impossible. Accordingly, there is a need for an integrated multiple digital processing device which provides information about what circuit is accessing external memory through the internal memory arbitration circuit, and a method for examining a digital processing system employing such a device which reveals information about what circuit is accessing external memory at a given moment.

SUMMARY OF THE INVENTION

The present invention solves the aforementioned problem and meets the aforementioned need by providing an integrated multiple digital processing device having externally-accessible connections, referred to herein as "tag" connections, which provide signals representative of what circuit has access to external memory used by the processing device. Ordinarily, the external memory would be DRAM. The processing device preferably includes a plurality of digital processor circuits, a DRAM refresh logic circuit, externally-accessible connections for receiving memory access signals from an external processor, and an arbitration circuit for determining which of the digital processor circuits, refresh logic circuit or external processor may have access to the external memory. The signals on the tag connections are provided by the arbitration circuit, and indicate which of the aforementioned circuits has access to the external memory at any moment. Preferably, an M-to-N line encoder is provided between the arbitration circuit and the externally-accessible tag connections to minimize the number of tag connections required to identify the circuit having access to the external memory.

Therefore, it is a principal object of the present invention to provide a novel and improved integrated digital processing device and method for examining the operation thereof It is another object of the present invention to provide an integrated digital processing device for use with external memory which provides externally-accessible signals which indicate which circuit has access to the external memory at any moment.

It is a further object of the present invention to provide an integrated digital processing device for use with external DRAM which includes a DRAM refresh logic circuit as well as one or more digital processor circuits, and which provides externally-accessible signals which indicate which circuit has access to the external DRAM at any moment.

It is yet another object of the present invention to provide an integrated digital processing device for use with external memory which includes externally-accessible connections for receiving memory access signals from an external processor as well as one or more internal digital processor circuits, and which provides externally-accessible signals which indicate which circuit has access to the external memory at any moment.

It is yet a further object of the present invention to provide a method for examining the operation of an integrated digital processing device wherein it is determined which of a plurality of possible circuits has access to external memory at any moment.

The foregoing and other objects, features and advantages of the present invention will be more readily understood upon consideration of the following detailed description of the invention, taken in conjunction with the following drawings.

BRIEF DESCRIPTION OF THE DRAWING

FIG. 1 is a block diagram of an integrated digital processing device according to the present invention.

DETAILED DESCRIPTION OF THE INVENTION

Referring to FIG. 1, an integrated digital processing device 10 according to the present invention is adapted for use with external memory 12 and preferably comprises a plurality of digital processor circuits 14 and a memory access arbitration circuit 16 for determining which of the processor circuits 14 is to have access to the external memory 12 at any moment. Preferably, the external memory 12 is DRAM. As DRAM requires periodic refreshing, the processing device 10 preferably includes, in addition to the processor circuits 12, a DRAM refresh logic circuit 18. However, it is to be recognized that types of memory other than DRAM could be used with the processing device of the invention without departing from the principles of the invention. These components are all part of an integrated circuit, as is commonly understood in the art, whose package places a limit on the practical number of externally-accessible connections thereto.

Each of the digital processor circuits 14 preferably provides a memory request signal line 20, data signal lines 22 and memory address signal lines 24. The request signal line 20 lets the arbitration circuit 16 know when the processor circuit 14 requests access to the external memory 12. The arbitration circuit 16 determines when and which of those requests will be granted, thereby providing the corresponding processor circuit 14 access to the external memory 12 over its data lines 22 and address lines 24.

The integrated digital processing device 10 includes externally-accessible connections 26, 28 and 30 for external memory control, data and address signals, respectively. The data and address connections, 28 and 30, correspond respectively to the data and address connections, 22 and 24, of the digital processors 12.

The refresh logic circuit 18 preferably provides a memory request signal line 32 and refresh address signal lines 34. The request signal line 32 lets the arbitration circuit 16 know when the refresh logic circuit 18 requests access to the external memory 12. The arbitration circuit provides access to the external memory by the refresh logic circuit at the earliest available time following an access request by the refresh logic circuit.

Preferably, the integrated digital processor device also includes externally-accessible connections 36, 38 and 40 for connection to memory access, data and address lines, respectively, of an external processor 42. This permits the processing device 10 to work with a more general purpose microprocessor whose access to the external memory, like the access by the internal digital processors 12, is arbitrated by the internal arbitration circuit 16.

To enable an external device to determine which circuit has access to the external memory at any moment, the arbitration circuit 16 provides signals representative of the identity of that circuit. That is, the arbitration circuit provides signals indicative of which of the digital processor circuits 14, the memory refresh logic circuit 18 or the external processor 42 has access to the external memory 12 at any moment. Since the access information would, according to commonly known logic design, ordinarily appear in raw form as a bit on one of a plurality of internal lines 44 corresponding, respectively, to the number of circuits which may have access to the external memory, the processing device 10 is preferably provided with a M-to-N line encoder 46, which minimizes the number of externally-accessible connections 48 (tag lines) required to identify the circuit having access to external memory. M represents the number of internal lines 44 providing the raw information, and N represents the number of externally-accessible connections 48. Preferably, binary encoding is used, so that, for example, if there were 8 internal lines 44, only 3 externally-accessible connections 48 would be needed.

A preferred method for examining the operation of the integrated digital processing device 10 of the present invention employs a logic analyzer 50 of a type commonly known in the art. Such a logic analyzer has a plurality of logic input lines 52 which are adapted to be connected to logic signal lines. A set 54 of those lines can be connected to the external memory control, data and address lines, 26, 28 and 30, respectively, to display or record the logic levels on those lines at any moment. In addition, another set 56 of the logic input lines 52 can be connected to the tag lines 48 to test to determine what device is producing the logic levels at that moment. The logic input lines 56 are connected to corresponding tag lines, and the logic levels on the logic input lines 52 are correlated with the device producing those logic levels at that moment to examine the operation of the processing device.

In addition, the logic analyzer 50 preferably includes a memory for storing data representative of the logic levels on the set of lines 54 and the corresponding device identified by the set of lines 56. This data may be supplied to another computer for post-processing at logic analyzer output port 58 for analysis of the data.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

We claim:

1. An integrated digital processing device adapted to communicate with external memory, comprising:

a plurality of digital processor circuits disposed within said integrated digital processing device; and a memory access arbitration circuit for determining which of said plurality of digital processor circuits is to have access to said external memory; wherein, said arbitration circuit includes at least one externally-accessible tag line for providing signals representative of which of said plurality of digital processor circuits currently has access to said external memory.

2. The processing device of claim 1, further comprising a dynamic random access memory (DRAM) refresh circuit, said external memory being dynamic random access memory (DRAM), and wherein, access to said external memory by said refresh circuit is determined by said arbitration circuit.

3. The processing device of claim 2, wherein, said arbitration circuit includes at least one externally-accessible processor connection for receiving external memory access signals from an external digital processor circuit, access to said external memory by said external processor circuit being determined by said arbitration circuit.

4. The processing device of claim 2, wherein, said arbitration circuit includes externally-accessible memory connections for conveying memory address, data and control signals to said external memory.

5. The processing device of claim 1, wherein, said arbitration circuit includes at least one externally-accessible processor connection for receiving external memory access signals from an external digital processor circuit, access to said external memory by said external processor circuit being determined by said arbitration circuit.

6. The processing device of claim 1, wherein, said arbitration circuit includes externally-accessible memory connections for conveying memory address, data and control signals to said external memory.

7. An integrated digital processing device adapted to communicate with external memory, comprising:

a plurality of digital processor circuits;

a memory access arbitration circuit for determining which of said plurality of digital processor circuits is to have access to said external memory; wherein, said arbitration circuit includes M tag lines for providing signals representative of which of said plurality of digital processor circuits currently has access to said external memory; and an M-to-N line encoder having an input coupled to said M tag lines of said arbitration circuit and an output comprising N externally-accessible tag connections so as to reduce the number of tag connections necessary to determine which circuit has access to said external memory from M in number to N in number.

8. A method for examining the operation of a digital processing system including an integrated digital processing device adapted to communicate with an external memory and having a plurality of digital processor circuits and a memory access arbitration circuit for determining which of said plurality of circuits is to have access to said external memory, and an external memory circuit connected through external memory connections to said digital processing device, said method comprising the steps of:

providing tag connections to said arbitration circuit which are accessible external to said processing device and carry signals representative of which circuit has access to said external memory;

detecting signals on said tag connections to determine which circuit currently has access to said external memory; and detecting signals on said external memory connections to observe memory address and data information accessed by said circuit currently having access to said memory.

9. The method of claim 8, wherein said detecting is performed using a logic analyzer apparatus.

10. The method of claim 9, further comprising providing data detected by said logic analyzer apparatus to another computer for further processing.

* * * * *